United States Patent
Deierling et al.

(10) Patent No.: US 8,069,395 B2
(45) Date of Patent: Nov. 29, 2011

(54) THREE BIT ERROR DETECTION USING ECC CODES

(75) Inventors: Kevin Deierling, Pescadero, CA (US); Hillel Gazit, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 861 days.

(21) Appl. No.: 12/038,886

(22) Filed: Feb. 28, 2008

(65) Prior Publication Data

US 2008/0215953 A1    Sep. 4, 2008

Related U.S. Application Data

(60) Provisional application No. 60/892,469, filed on Mar. 1, 2007.

(51) Int. Cl.
*H03M 13/00*    (2006.01)
(52) U.S. Cl. ......... 714/759; 714/758; 714/763; 714/752

(58) Field of Classification Search .................. 714/752, 714/758, 759, 763
See application file for complete search history.

(56) References Cited

U.S. PATENT DOCUMENTS

2003/0101405 A1 *    5/2003    Shibata ........................ 714/763
* cited by examiner

*Primary Examiner* — Sam Rizk
(74) *Attorney, Agent, or Firm* — Patterson & Sheridan, LLP

(57) ABSTRACT

An Error Correction Code (ECC) encoding module encodes an input data word by calculating parity bits according to an ECC index mapping. An ECC correction/detection module receives the encoded data word that may have become corrupted due to noise or distortion. The ECC correction/detection module executes a parity calculation on the encoded data word based on the ECC index mapping. Based on the parity calculation, the ECC correction/detection module can detect and correct a single bit error, detect if there is an error to an even number of bits, and detect the occurrence of a three consecutive bit burst error.

20 Claims, 10 Drawing Sheets

| Physical Location | ECC Index | Binary Value (count of 1 bits) |
|---|---|---|
| 0 | 0 | 00000000 (0 bits) |
| 1 | 1 | 00000001 (1 bits) |
| 2 | 2 | 00000010 (1 bits) |
| 3 | 15 | 00001111 (4 bits) |
| 4 | 14 | 00001110 (3 bits) |
| 5 | 4 | 00000100 (1 bits) |
| 6 | 27 | 00011011 (4 bits) |
| 7 | 28 | 00011100 (3 bits) |
| 8 | 13 | 00001101 (3 bits) |
| 9 | 23 | 00010111 (4 bits) |
| 10 | 25 | 00011001 (3 bits) |
| 11 | 11 | 00001011 (3 bits) |
| 12 | 30 | 00011110 (4 bits) |
| 13 | 22 | 00010110 (3 bits) |
| 14 | 26 | 00011010 (3 bits) |
| 15 | 29 | 00011101 (4 bits) |
| 16 | 21 | 00010101 (3 bits) |
| 17 | 16 | 00010000 (1 bits) |
| 18 | 39 | 00100111 (4 bits) |
| 19 | 52 | 00110100 (3 bits) |
| 20 | 31 | 00011111 (5 bits) |
| 21 | 46 | 00101110 (4 bits) |
| 22 | 50 | 00110010 (3 bits) |
| 23 | 8 | 00001000 (1 bits) |
| 24 | 57 | 00111001 (4 bits) |
| 25 | 55 | 00110111 (5 bits) |
| 26 | 7 | 00000111 (3 bits) |
| 27 | 51 | 00110011 (4 bits) |
| 28 | 49 | 00110001 (3 bits) |
| 29 | 19 | 00010011 (3 bits) |
| 30 | 43 | 00101011 (4 bits) |
| 31 | 59 | 00111011 (5 bits) |
| 32 | 56 | 00111000 (3 bits) |
| 33 | 60 | 00111100 (4 bits) |
| 34 | 37 | 00100101 (3 bits) |
| 35 | 61 | 00111101 (5 bits) |
| 36 | 58 | 00111010 (4 bits) |
| 37 | 38 | 00100110 (3 bits) |
| 38 | 62 | 00111110 (5 bits) |
| 39 | 89 | 01011001 (4 bits) |
| 40 | 100 | 01100100 (3 bits) |
| 41 | 44 | 00101100 (3 bits) |
| 42 | 75 | 01001011 (4 bits) |
| 43 | 98 | 01100010 (3 bits) |
| 44 | 42 | 00101010 (3 bits) |
| 45 | 77 | 01001101 (4 bits) |
| 46 | 97 | 01100001 (3 bits) |
| 47 | 47 | 00101111 (5 bits) |
| 48 | 71 | 01000111 (4 bits) |
| 49 | 107 | 01101011 (5 bits) |
| 50 | 41 | 00101001 (3 bits) |
| 51 | 78 | 01001110 (4 bits) |
| 52 | 110 | 01101110 (5 bits) |
| 53 | 35 | 00100011 (3 bits) |
| 54 | 92 | 01011100 (4 bits) |
| 55 | 124 | 01111100 (5 bits) |
| 56 | 104 | 01101000 (3 bits) |
| 57 | 53 | 00110101 (4 bits) |
| 58 | 94 | 01011110 (5 bits) |
| 59 | 109 | 01101101 (5 bits) |
| 60 | 54 | 00110110 (4 bits) |
| 61 | 88 | 01011000 (3 bits) |
| 62 | 103 | 01100111 (5 bits) |
| 63 | 45 | 00101101 (4 bits) |
| 64 | 73 | 01001001 (3 bits) |
| 65 | 117 | 01110101 (5 bits) |

Example Mapping for (179,170) Code

FIG. 7A

| Physical Location | ECC Index | Binary Value (count of 1 bits) |
|---|---|---|
| 66 | 120 | 01111000 (4 bits) |
| 67 | 76 | 01001100 (3 bits) |
| 68 | 32 | 00100000 (1 bits) |
| 69 | 105 | 01101001 (4 bits) |
| 70 | 74 | 01001010 (3 bits) |
| 71 | 115 | 01110011 (5 bits) |
| 72 | 113 | 01110001 (4 bits) |
| 73 | 67 | 01000011 (3 bits) |
| 74 | 112 | 01110000 (3 bits) |
| 75 | 114 | 01110010 (4 bits) |
| 76 | 64 | 01000000 (1 bits) |
| 77 | 118 | 01110110 (5 bits) |
| 78 | 116 | 01110100 (4 bits) |
| 79 | 70 | 01000110 (3 bits) |
| 80 | 122 | 01111010 (5 bits) |
| 81 | 108 | 01101100 (4 bits) |
| 82 | 87 | 01010111 (5 bits) |
| 83 | 121 | 01111001 (5 bits) |
| 84 | 106 | 01101010 (4 bits) |
| 85 | 82 | 01010010 (3 bits) |
| 86 | 79 | 01001111 (5 bits) |
| 87 | 85 | 01010101 (4 bits) |
| 88 | 91 | 01011011 (5 bits) |
| 89 | 81 | 01010001 (3 bits) |
| 90 | 90 | 01011010 (4 bits) |
| 91 | 84 | 01010100 (3 bits) |
| 92 | 143 | 10001111 (5 bits) |
| 93 | 216 | 11011000 (4 bits) |
| 94 | 93 | 01011101 (5 bits) |
| 95 | 134 | 10000110 (3 bits) |
| 96 | 210 | 11010010 (4 bits) |
| 97 | 69 | 01000101 (3 bits) |
| 98 | 148 | 10010100 (3 bits) |
| 99 | 212 | 11010100 (4 bits) |
| 100 | 193 | 11000001 (3 bits) |
| 101 | 151 | 10010111 (5 bits) |
| 102 | 83 | 01010011 (4 bits) |
| 103 | 199 | 11000111 (5 bits) |
| 104 | 145 | 10010001 (3 bits) |
| 105 | 102 | 01100110 (4 bits) |
| 106 | 244 | 11110100 (5 bits) |
| 107 | 155 | 10011011 (5 bits) |
| 108 | 101 | 01100101 (4 bits) |
| 109 | 248 | 11111000 (5 bits) |
| 110 | 158 | 10011110 (5 bits) |
| 111 | 99 | 01100011 (4 bits) |
| 112 | 241 | 11110001 (5 bits) |
| 113 | 152 | 10011000 (3 bits) |
| 114 | 86 | 01010110 (4 bits) |
| 115 | 205 | 11001101 (5 bits) |
| 116 | 157 | 10011101 (5 bits) |
| 117 | 209 | 11010001 (4 bits) |
| 118 | 206 | 11001110 (5 bits) |
| 119 | 128 | 10000000 (1 bits) |
| 120 | 204 | 11001100 (4 bits) |
| 121 | 200 | 11001000 (3 bits) |
| 122 | 133 | 10000101 (3 bits) |
| 123 | 201 | 11001001 (4 bits) |
| 124 | 196 | 11000100 (3 bits) |
| 125 | 140 | 10001100 (3 bits) |
| 126 | 202 | 11001010 (4 bits) |
| 127 | 194 | 11000010 (3 bits) |
| 128 | 137 | 10001001 (3 bits) |
| 129 | 195 | 11000011 (4 bits) |
| 130 | 203 | 11001011 (5 bits) |
| 131 | 138 | 10001010 (3 bits) |

Example Mapping for (179,170) Code (continued)

FIG. 7B

| Physical Location | ECC Index | Binary Value (count of 1 bits) |
|---|---|---|
| 132 | 197 | 11000101 (4 bits) |
| 133 | 208 | 11010000 (3 bits) |
| 134 | 181 | 10110101 (5 bits) |
| 135 | 228 | 11100100 (4 bits) |
| 136 | 211 | 11010011 (5 bits) |
| 137 | 182 | 10110110 (5 bits) |
| 138 | 225 | 11100001 (4 bits) |
| 139 | 214 | 11010110 (5 bits) |
| 140 | 179 | 10110011 (5 bits) |
| 141 | 218 | 11011010 (5 bits) |
| 142 | 232 | 11101000 (4 bits) |
| 143 | 176 | 10110000 (3 bits) |
| 144 | 217 | 11011001 (5 bits) |
| 145 | 198 | 11000110 (4 bits) |
| 146 | 168 | 10101000 (3 bits) |
| 147 | 236 | 11101100 (5 bits) |
| 148 | 139 | 10001011 (4 bits) |
| 149 | 230 | 11100110 (5 bits) |
| 150 | 233 | 11101001 (5 bits) |
| 151 | 142 | 10001110 (4 bits) |
| 152 | 229 | 11100101 (5 bits) |
| 153 | 234 | 11101010 (5 bits) |
| 154 | 141 | 10001101 (4 bits) |
| 155 | 227 | 11100011 (5 bits) |
| 156 | 213 | 11010101 (5 bits) |
| 157 | 180 | 10110100 (4 bits) |
| 158 | 224 | 11100000 (3 bits) |
| 159 | 220 | 11011100 (5 bits) |
| 160 | 184 | 10111000 (4 bits) |
| 161 | 164 | 10100100 (3 bits) |
| 162 | 131 | 10000011 (3 bits) |
| 163 | 166 | 10100110 (4 bits) |
| 164 | 167 | 10100111 (5 bits) |

| Physical Location | ECC Index | Binary Value (count of 1 bits) |
|---|---|---|
| 165 | 161 | 10100001 (3 bits) |
| 166 | 135 | 10000111 (4 bits) |
| 167 | 162 | 10100010 (3 bits) |
| 168 | 173 | 10101101 (5 bits) |
| 169 | 178 | 10110010 (4 bits) |
| 170 | 242 | 11110010 (5 bits) |
| 171 | 171 | 10101011 (5 bits) |
| 172 | 226 | 11100010 (4 bits) |
| 173 | 146 | 10010010 (3 bits) |
| 174 | 174 | 10101110 (5 bits) |
| 175 | 172 | 10101100 (4 bits) |
| 176 | 185 | 10111001 (5 bits) |
| 177 | 186 | 10111010 (5 bits) |
| 178 | 147 | 10010011 (4 bits) |

Example Mapping for (179,170) Code (continued)

FIG. 7C

| Physical Location | ECC Index | Physical Location | ECC Index | Physical Location | ECC Index |
|---|---|---|---|---|---|
| 0 | 0 | 31 | 35 | 62 | 105 |
| 1 | 1 | 32 | 17 | 63 | 114 |
| 2 | 30 | 33 | 45 | 64 | 52 |
| 3 | 48 | 34 | 19 | 65 | 113 |
| 4 | 49 | 35 | 9 | 66 | 90 |
| 5 | 46 | 36 | 39 | 67 | 116 |
| 6 | 40 | 37 | 16 | 68 | 67 |
| 7 | 25 | 38 | 10 | 69 | 96 |
| 8 | 6 | 39 | 37 | 70 | 108 |
| 9 | 36 | 40 | 18 | 71 | 82 |
| 10 | 13 | 41 | 120 | 72 | 101 |
| 11 | 54 | 42 | 69 | 73 | 106 |
| 12 | 20 | 43 | 34 | 74 | 32 |
| 13 | 21 | 44 | 72 | 75 | 85 |
| 14 | 58 | 45 | 81 | 76 | 78 |
| 15 | 24 | 46 | 38 | 77 | 44 |
| 16 | 28 | 47 | 104 | 78 | 77 |
| 17 | 27 | 48 | 97 | 79 | 86 |
| 18 | 60 | 49 | 22 | 80 | 76 |
| 19 | 56 | 50 | 88 | 81 | 65 |
| 20 | 43 | 51 | 112 | 82 | 80 |
| 21 | 12 | 52 | 7 | 83 | 14 |
| 22 | 8 | 53 | 64 | 84 | 99 |
| 23 | 51 | 54 | 26 | 85 | 83 |
| 24 | 5 | 55 | 100 | 86 | 15 |
| 25 | 41 | 56 | 73 | 87 | 98 |
| 26 | 3 | 57 | 50 | 88 | 2 |
| 27 | 53 | 58 | 84 | 89 | 127 |
| 28 | 11 | 59 | 89 | 90 | 74 |
| 29 | 33 | 60 | 66 | 91 | 42 |
| 30 | 29 | 61 | 4 | 92 | 23 |

Example Mapping for (93, 85) Code

FIG. 8

THREE BIT ERROR DETECTION USING ECC CODES

RELATED APPLICATIONS

This application claims priority from U.S. provisional application No. 60/892,469 entitled "System and Method for Three Bit Error Detection Using ECC Codes" filed on Mar. 1, 2007, the content of which is incorporated by reference herein in its entirety.

TECHNICAL FIELD

The present disclosure relates generally to error detection and correction.

BACKGROUND

The ability to detect and correct errors is an important feature of data transmission and data storage systems. Transmitted or stored data is often susceptible to noise or distortion that can cause bits to "flip", corrupting the integrity of the data. A common technique for error detection and correction involves adding additional bits known as "parity bits" to a data word. The parity bits are calculated in such a way that they reflect characteristics of the data word. For example, in one conventional technique, each parity bit is associated with a different subset of bits in the data word. The parity bit is set to 1 if an odd number of bits in the associated subset are set to 1. The parity bit is set to 0 if an even number of bits in the associated subset are set to 1. Thus, any parity bit together with its associated subset of bits will contain an even number of 1s. The parity bits are then encoded together with the data word. At a later time (e.g., after transmission of an encoded data word), a similar parity calculation is executed to determine if the parity bits are still correct (i.e. if a parity bit together with its associated subset of bits still contains an even number of 1s). If a bit changes during transmission of the data word, one or more parity bits will be incorrect (i.e. the parity bit together with its associated subset of bits contains an odd number of 1s). This indicates an error in the data word.

An example of a common error detection/correction code is a SECDED (Single Error Correction Double Error Detection) Hamming code. As is known in the art, a SECDED Hamming code computes parity bits in such a way that a change to any single bit produces a unique "error code" derived from the parity calculation. By examining which parity bits are incorrect, the single bit in error can be identified and can therefore be corrected. Furthermore, the parity bits are calculated in such a way that a two bit error (or other even numbered bit error) can be detected. However, two bit errors are not correctable.

The conventional SECDED Hamming code is not able to detect three bit errors. Rather, in the presence of a three bit error, a conventional SECDED code returns an error code that is indistinguishable from an error code resulting from a single bit error. Therefore, in the presence of a three bit error, a conventional Error Correction Code (ECC) circuit will erroneously "correct" a bit that may actually be valid. This further corrupts the integrity of the data. Therefore, what is needed is an ECC module that can distinguish between three bit errors and single bit errors.

SUMMARY

In a first embodiment, methods and systems encode an input data word for error detection and correction. An input data word is received. Parity bits are calculated based on the input data word and an ECC index mapping. The ECC index mapping maps each physical bit location to an ECC index such that an XOR operation executed on ECC indices corresponding to three physically consecutive bits produces an error word distinguishable from each of the ECC indices mapped to the physical bit locations. The calculated parity bits are encoded with the input data word.

In a second embodiment, method and systems correct and/or detect one or more errors in an encoded word. The encoded data word is received. A parity calculation is executed on the encoded word to determine an error code word based on an ECC index mapping between bit locations of the encoded word and ECC indices. The error code word resulting from a single bit error at a first bit location comprises a first ECC index corresponding to the first bit location. The error code word resulting from errors in three physically consecutive bits of the encoded word is distinguishable from each of the ECC indices. Thus, three bit burst errors are distinguishable from single bit errors.

BRIEF DESCRIPTION OF DRAWINGS

FIGS. 7A-7C is a table illustrating an example mapping between physical bit locations and ECC indices for a (179, 170) coding.

FIG. 8 is a table illustrating an example mapping between physical bit locations and ECC indices for a (93, 85) coding.

DESCRIPTION OF EXAMPLE EMBODIMENTS

Overview

In a first embodiment, methods and systems encode an input data word for error detection and correction. An input data word is received. Parity bits are calculated based on the input data word and an ECC index mapping. The ECC index mapping maps each physical bit location to an ECC index such that an XOR operation executed on ECC indices corresponding to three physically consecutive bits produces an error word distinguishable from each of the ECC indices mapped to the physical bit locations. The calculated parity bits are encoded with the input data word.

In a second embodiment, method and systems correct and/or detect one or more errors in an encoded word. The encoded data word is received. A parity calculation is executed on the encoded word to determine an error code word based on an ECC index mapping between bit locations of the encoded word and ECC indices. The error code word resulting from a single bit error at a first bit location comprises a first ECC index corresponding to the first bit location. The error code word resulting from errors in three physically consecutive bits of the encoded word is distinguishable from each of the ECC indices. Thus, three bit burst errors are distinguishable from single bit errors.

System Architecture

Figure 1:
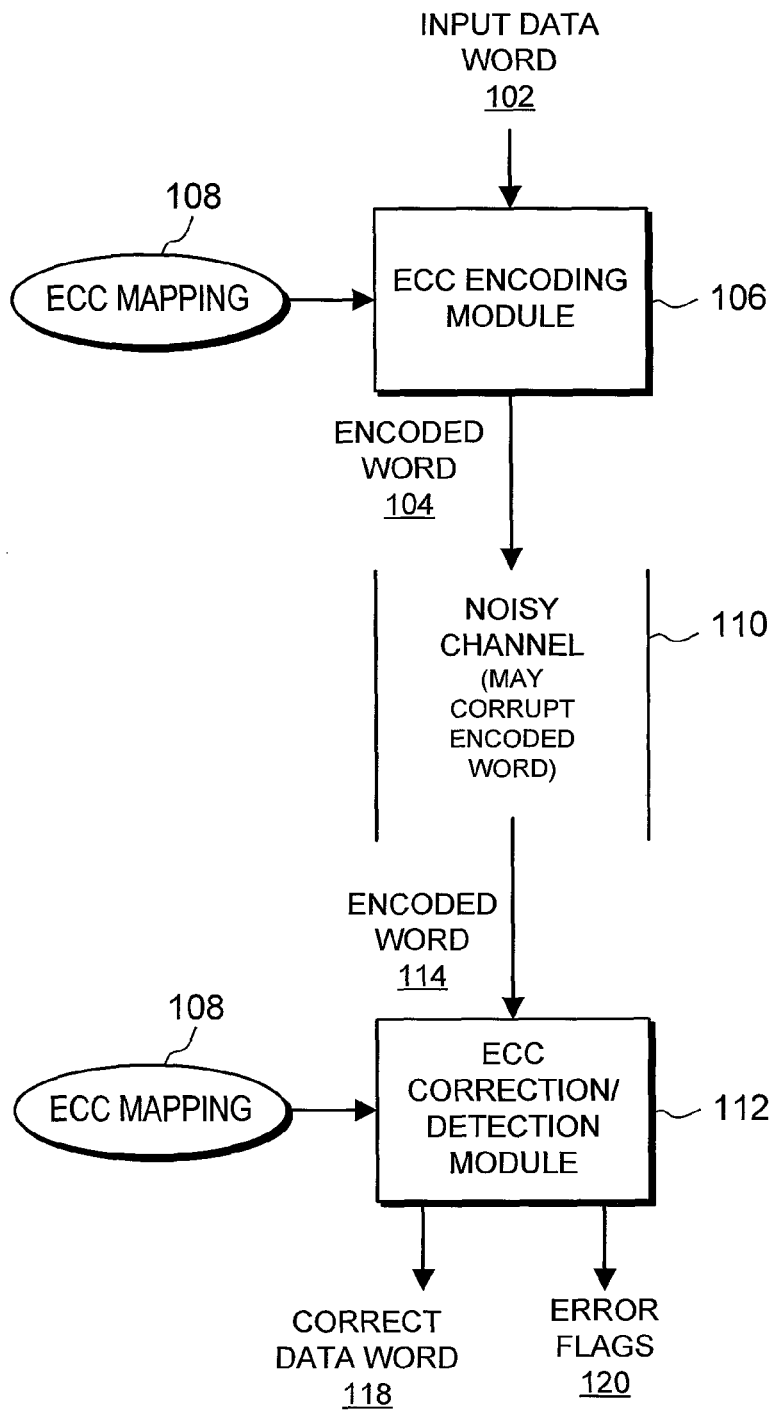
FIG. 1 is a block diagram illustrating an example embodiment of a system for error detection and correction.

FIG. 1 illustrates an example embodiment of a system for error detection and correction. An error correction code (ECC) encoding module 106 receives an input data word 102. The ECC encoding module 106 may be implemented, for example, as an application specific integrated circuit (ASIC), field programmable gate array (FPGA), or other hardware implementation. Alternatively, the ECC encoding module 106 may be embodied as computer executable instructions stored on a computer readable medium and executable by a processor. Based on an ECC mapping 108, the ECC encoding module 106 encodes the input data word 102 by adding parity bits to the input data word 102 that reflect characteristics of the input data word 102. The ECC mapping 108 specifies how the parity bits are calculated based on the input data word 102 as will be described in further detail below. The ECC mapping 108 may be stored in a storage module such as a hard drive, a Digital Versatile Disk (DVD), Compact Disk (CD), FLASH device, a dynamic random access memory (DRAM device), a static random access memory (SRAM), device, a combination of the above, or other memory/storage device known in the art.

An encoded word 104 is outputted through a noisy channel 110 that may corrupt the encoded word 104. The noisy channel 110 may be, for example, a transmission system (such as a network) that transmits the encoded word 104 from a first storage location to a second remote storage location. Alternatively, the noisy channel 110 may simply be a memory that is susceptible to data corruption. Thus, the encoded word 114 exiting the channel 110 may be different than the encoded word 104 entering the channel 110 if the encoded word 104 is corrupted by noise or distortion in the channel 110.

An ECC correction/detection module 112 is positioned, for example, at the front end of a receiving device or memory read circuitry, and reads the encoded word 114 (that may be corrupted). The ECC correction/detection module 112 may be implemented, for example, as an application specific integrated circuit (ASIC), field programmable gate array (FPGA), or other hardware implementation. Alternatively, the ECC correction/detection module 112 may be embodied as computer executable instructions stored on a computer readable medium and executable by a processor.

The ECC correction/detection module 112 executes error correction/detection calculations on the encoded word 114 according to the ECC mapping 108 defining the parity calculations. In one embodiment, the ECC correction/detection module 112 is able to correct certain classes of errors and detect (but not correct) other classes of errors. If a correctable error is discovered, the ECC correction/detection module 112 corrects the error and outputs the corrected data word 118. If the ECC correction/detection module 112 detects an uncorrectable error, the ECC correction/detection module 112 outputs error flags 120 indicating the type of error detected.

In one embodiment, the ECC correction/detection module 112 can detect and correct any single bit error. Furthermore, the ECC correction/detection module 112 can detect (but not correct) any occurrences of an even number of bit errors. The ECC correction/detection module 112 can also detect certain classes of three bit errors. For example, in one embodiment, the ECC correction/detection module 112 can detect any three bit burst error that occurs in 3 physically consecutive bits. Detection of three bit burst errors is advantageous because in the real world, bit errors tend to be closely related in space and/or time (i.e. burst errors). For example, interference in a serial stream of data may last for a finite period of time so that several bits in a row are corrupted before normal reception resumes. Similarly, in memories, physical phenomena (such as, for example, soft errors caused by neutrons or alpha particles) often result in burst errors which are physically contiguous.

The following sections provide example embodiments of methods that can be executed by the ECC encoding module 106 and ECC correction/detection module 112 to implement a single error correction (SEC) Hamming code and a single error correction double error detection (SECDED) Hamming code. An extension to the SECDED Hamming code is then described that allows for detection of 3 consecutive bit burst errors.

SEC Hamming Code

Hamming codes are generated for an input data word by adding error correcting parity bits to the original data word. The specific type of Hamming code is generally referred to as a Hamming (M, D) code where M is the number of bits after the parity bits are added and D is the number of data bits before the parity bits are added. For example, a common Hamming code is a Hamming (7, 4) code which encodes a 4-bit original data word into 7 bits by adding 3 parity bits.

The Hamming code is created by placing parity bits (P3-P1) at all bit "locations" that are a power of two (i.e. at bit locations 1, 2, 4, . . . ). All other bit locations are filled in with the data word (D3-D0) to be encoded as shown in Table 1 for the example Hamming (7,4) code:

TABLE 1

| Parity and Data bit location mapping | | | | | | | |
|---|---|---|---|---|---|---|---|
| | Bit Location | | | | | | |
| | 7 | 6 | 5 | 4 | 3 | 2 | 1 |
| Data/Parity Bit | D3 | D2 | D1 | P3 | D0 | P2 | P1 |

It is noted that the term "location" is actually an abstract notion of an "ECC index" and does not necessarily correspond to a physical bit location. Rather, it is simply a convenient way to refer to the ECC index and indicate how parity is calculated over the individual values. To illustrate the concept of parity calculation, an example is provided in which the ECC indices directly map to the bit locations. However, as will be shown below, the ECC index and the physical bit location are not necessarily the same but rather a bit associated with any ECC index can be placed at any physical location. The ECC index defines how a particular bit contributes to various parity calculations as will be further described below.

It is furthermore noted that in the example above and the discussion that follows, the parity bits start with P1 at a "location" 1, rather than the having a starting index of 0. The reason for this representation will become apparent later on when the SECDED Hamming code is introduced.

In one embodiment that uses a direct mapping between ECC index and bit location, a parity bit at location 'N' is associated with a subset of data bits at bit locations that have bit 'N' set in the with the subset of bits at bit locations 1, 3, 5, 7 . . . because each of 1, 3, 5, 7 . . . have bit location '1' bit set in their binary representation. P2 is associated with the subset of bits at bit locations 3, 6, 7, 10, 11 . . . because each of these values have bit location '2' set in their binary representation. P3 is associated with the subset of bits at locations 4, 5, 6, 7, 11, 12, 13, 14, 18 . . . , and so on. Using the general rule described above, Table 2 illustrates which bit locations are associated with each parity bit in the example Hamming (7,4) code.

TABLE 2

Bits Used for Parity Bit Calculation

| | Bit Location | | | | | | |
|---|---|---|---|---|---|---|---|
| | 7 | 6 | 5 | 4 | 3 | 2 | 1 |
| | | | | Data/Parity Bit | | | |
| | D3 | D2 | D1 | P3 | D0 | P2 | P1 |
| Parity Bit Calculations | | | | | | | |
| Parity Bit Number | Bit Location Used for Parity Bit | | | | | | |
| P1 | X | | X | | X | | X |
| P2 | X | X | | | X | X | |
| P3 | X | X | X | X | | | |

Each parity bit is set such that the parity over the subset of associated data bits (including the parity bit) is even. This is also equivalent to setting the parity bit to the XOR of the associated subset of data bits excluding the parity bit. For example, parity bit P1 can be calculated by XORing the bits at bit locations 3, 5, and 7. P2 is calculated by XORing the bits at bit locations 3, 6, and 7. P3 is calculated by XORing the bits at bit locations 5, 6, and 7.

An example parity bit computation is provided for the sample 4-bit data word (1001). The data word is inserted at the appropriate bit locations as illustrated in Table 3 below. P1 is calculated by XORing bits D3, D1, and D0 and results in P1=0. P2 is calculated by XORing bits D3, D2, and D0 and results in P2=0. P3 is calculated by XORing D3, D2, and D1 and results in P3=1. Thus the final ECC word is given as 1001100.

TABLE 3

Sample parity bit calculation.

| | Bit Location | | | | | | | |
|---|---|---|---|---|---|---|---|---|
| | 8 | 7 | 6 | 5 | 4 | 3 | 2 | 1 |
| | | | | | Data/Parity Bit | | | |
| | P4 | D3 | D2 | D1 | P3 | D0 | P2 | P1 |
| Example for data word 1001 (before ECC) | | | | | | | | |
| Data Word Without Parity | | 1 | 0 | 0 | | 1 | | |
| P1 | | 1 | | 0 | | 1 | | 0 |
| P2 | | 1 | 0 | | | 1 | 0 | |
| P3 | | 1 | 0 | 0 | 1 | | | |
| Resulting ECC Word | | 1 | 0 | 0 | 1 | 1 | 0 | 0 |

This method of encoding ensures that if an error occurs at any bit location (i.e. the bit is inverted), the error can be uniquely detected and corrected. Thus, the above encoding describes an example of a single error correcting code (SEC).

Figure 2:
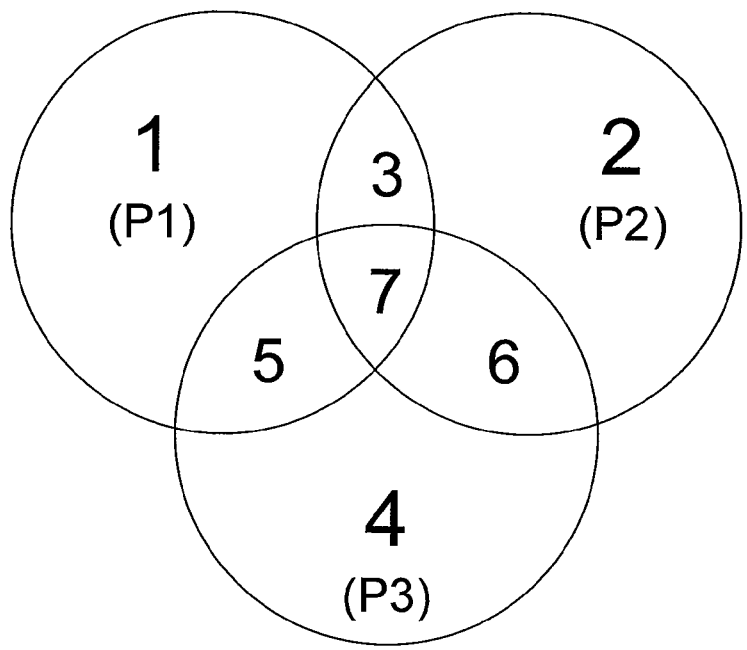
FIG. 2 is a diagram illustrating the relationship between bit locations and the parity bit calculation for an example (7,4) code.

FIG. 2 is a diagram illustrating the relationships described above between the parity bits and their associated subset of data bits for a Hamming (7,4) code with a direct mapping. Each overlapping circle corresponds to a parity bit and encloses the 4 bit locations contributing to that parity computation. For example, the data bit at location 3 contributes to parity bits at bit locations 1 and 2 (P1 and P2). Data bit 7 contributes to the parity bits at bit locations 1, 2, and 4 (P1, P2, P3). Each circle encompasses a total of four bits and the parity bits are calculated such that each circle has even parity if there are no bit errors.

It can be observed from FIG. 2 that an error in any one bit numbered 1 . . . 7 uniquely affects the three parity bits. For example, an error in bit 7 affects all three parity bits (P3-P1). An error in bit 6 affects only parity bits P2 and P3 while an error in any of the parity bits (at bit locations 1, 2, 4) affects only that parity bit. The location of any single bit error is determined directly upon checking the three parity bits.

For example, consider the data word (1101) encoded as 1100110 using the process described above. Suppose the encoded word 1100110 is affected by a single bit error such that the corrupted codeword 1110110 results. The above error (at bit location 5) can be corrected by examining which of the three parity bits was affected by the bad bit. Parity is calculated for each parity bit together with its associated subset of data bits using the same associations described above and as illustrated in FIG. 2. As mentioned previously, if there are no errors, each parity calculation should result in even parity (i.e. the parity bit and the associated subset of bits should XOR to 0). However, in the case of the corrupted codeword 1110110, the following parity calculation is obtained as illustrated in Table 4:

TABLE 4

Sample parity calculation for corrupted word.

| | 7 | 6 | 5 | 4 | 3 | 2 | 1 | BIT LOCATIONS |
| | 1 | 1 | 1 | 0 | 1 | 1 | 0 | 7-BIT CODEWORD |
| P1 | 1 | — | 1 | — | 1 | — | 0 | (ODD PARITY) | 1 |
| P2 | 1 | 1 | — | — | 1 | 1 | — | (EVEN PARITY) | 0 |
| P3 | 1 | 1 | 1 | 0 | — | — | — | (ODD PARITY) | 1 |

In this case, it is found that parity bits P3 and P1 are incorrect (i.e. the parity bit together with its associated subset of data bits XOR to 1). This is because both of these parity bits are affected by an error to bit 5. Parity bit P2 is correct (even parity) because the error to bit 5 does not affect P2. This result is expressed as an error code word P3:P1=101. The error code word can be matched to an ECC index indicating the location of the error. Because a direct mapping was used, the ECC index is the same as the physical bit location. Thus, the returned ECC index of 101 (binary representation of 5) correctly points directly to the bit location of the error (bit 5). The corrupted bit can then be corrected. Examination of the parity circles confirms that any single bit error can be detected and corrected in this way. Note that when any data bit is corrupted there are at least two parity bits that are affected. Should a parity bit itself become corrupted only a single parity bit will be incorrect and the error code will indicate the corrupt parity bit.

SECDED Hamming Code

As noted above, the SEC Hamming Code is only able to detect and correct single bit errors. The SEC Hamming Code is unable to detect 2 bit errors. For example, suppose that bits at locations 3 and 6 are corrupted. As can be seen from FIG. 2, the error to bit 3 affects parity bits P1 and P2, while the error to bit 6 affects parity bits P2 and P3. The results in an error code word of P3:P1=101. Note that because parity bit P2 is affected by both the errors to bits 3 and 6, the errors cancel each other out and the parity is even. It is also observed that an error code word resulting from multiple bit errors is equivalent to the XOR of the error code words resulting from each individual bit error. Thus, for example, the error code produced by an error to bits 3 and 6 (101) is the XOR of the error codes that would be produced by single bit errors to bit 3 (011) and bit 6 (110)., In this case, the two bit error would incorrectly be interpreted as a single bit error at bit location 5.

Figure 3:
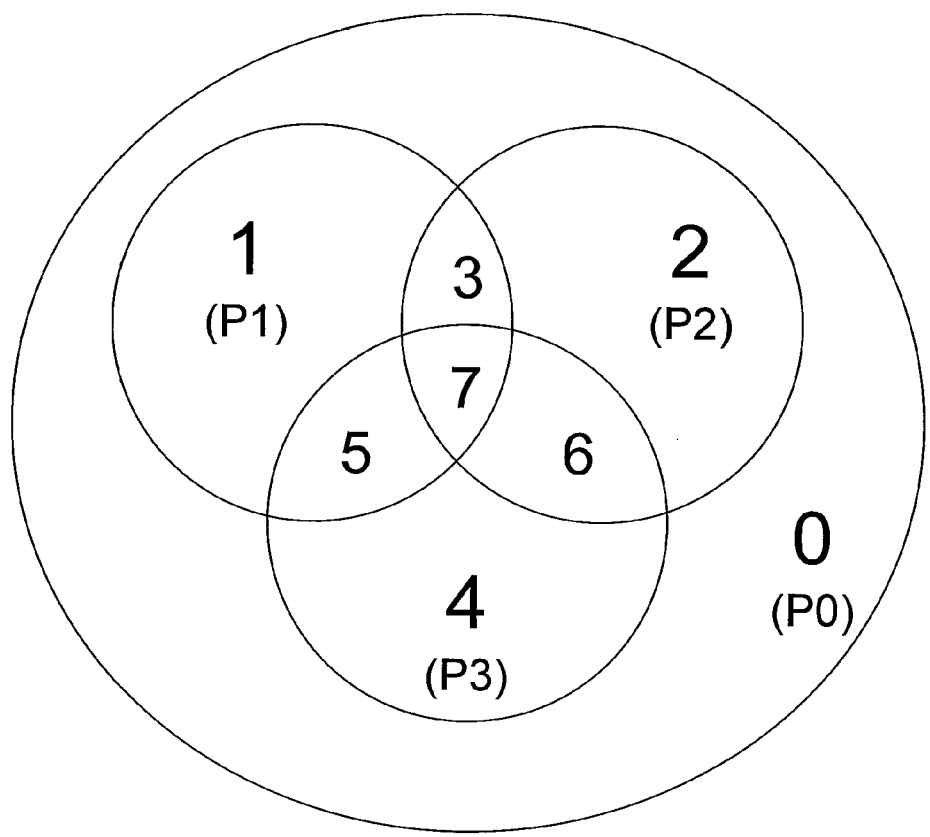
FIG. 3 is a diagram illustrating the relationship between bit locations and the parity bit calculation for an example (8,4) code.

A SECDED Hamming Code (Single Error Correction Double Error Detection) modifies the SEC Hamming code described above by adding an additional parity bit (P0). The parity bit P0 is computed over the entire encoded word (the data bits and the parity bits). This can be visually represented by the overlapping circles of FIG. 3. FIG. 3 is similar to FIG. 2 but includes an additional parity bit P0 represented by a circle encompassing all of the bits. For example, if the encoded word has an even number of 1s, P0 is set to 0. If the encoded word has an odd number of 1s, P0 is set to 1. Thus, if a single bit error occurs, the parity over the entire word (including all parity bits) will be odd and the corrupted bit can be identified by examining the remaining parity bits using the technique above. If any number of even bits are in error (including the case of no errors), then the overall parity will be even and P0 will be 0. Thus, if P0 is incorrect (i.e. odd parity over the entire word) and the other parity bits are incorrect, than this indicates a correctable single bit error. If, on the other hand, P0 is correct (i.e. even parity over the entire word) and the other parity bits are incorrect, then this indicates an uncorrectable error. If all parity bits are correct, then no error is detected.

Extending the Hamming (7,4) code to an (8,4) coding by including the P0 bit allows all single bit errors to be correctable and two bits errors to be detectable. This is referred to as a single error correcting, double error detecting (SECDED) Hamming code. While the examples above focus on the (8,4) ECC code it should be apparent that the described techniques can be extended such that D data bits can be encoded with an additional ($\log_2 D+2$) parity bits. Thus, for example, a 128 bit value can be encoded into a 128+9 bit value or (137, 128) ECC encoded. This ensures that all single bit errors can be both detected and corrected and all double bit errors can be detected.

Three Bit Burst Error Detection

In a conventional SECDED Hamming code, three bit errors are indistinguishable from single bit errors. For example, consider the data word (1101) encoded as 11001100 (including parity bit P0). A three bit burst error occurs and bits 2, 3, and 4 are flipped resulting in a corrupted word 11010000. A parity calculation on the corrupted code word results in an error code P3:P1=101 and P0=1. This error code is expected because it is the XOR of the error code that would result from single bit errors to bits 2, 3, and 4, i.e. the XOR of 010, 011, and 100. This is the same result as if there were only a single bit error at bit 5.

In some situations, it is possible to selectively choose an indirect mapping between the ECC indices and the physical bit locations so that certain types of three bit errors can also be detected. This technique is applicable in situations where there are unused error codes (i.e. possible error codes that do not correspond to any ECC index mapped to the physical bit locations). For example, consider a [179, 170] code, for correcting a memory that is 170 bits. In this example, 9 parity bits (P8-P0) are added to a 170 bit data word (D169-D0). Using a conventional SECDED code, 8 of the parity bits P8-P1 (the error code) correspond to an ECC index that identifies the location of a single bit error. There are $2^8=256$ possible error codes but only 170 are used because there are only 170 bit locations where an error may occur. In other words, the correctable code space is sparsely populated.

In one embodiment, a mapping between ECC indices and physical bit locations can be developed such that the error code resulting from any three bit burst error points to a value outside the valid range of ECC indices. For example, in one embodiment the mapping between physical bit locations 0-178 and ECC indices are distributed such that any three bit burst error results in an error code that is greater than 178. Then, an uncorrectable three bit burst error is distinguishable from a correctable 1 bit error.

An alternative approach is to designate each possible error code as either a "goodcode" or a "badcode". Each of the valid physical bit locations is mapped to a different "goodcode" and remaining codes are designated as "badcodes". In one embodiment, the possible error codes are designated as either "goodcodes" or "badcodes" based on the total number of 1's in the binary representation. The distribution of the number of 1s in the binary representation of the values from 0 to 255 is provided in the following table:

TABLE 5

Distribution of 1s in binary representation of values in range [0, 255].

| | Number of 1s in Binary Representation | | | | | | | | |
|---|---|---|---|---|---|---|---|---|---|
| | 0 | 1 | 2 | 3 | 4 | 5 | 6 | 7 | 8 |
| Number of Values in Range [0, 255] | 1 | 8 | 28 | 56 | 70 | 56 | 28 | 8 | 1 |

Based on the number of 1s in their binary representation, each possible error code is mapped to the set of "goodcodes" or the set of "badcodes" such that the appropriate number of "goodcodes" and "badcodes" is approximately achieved. For instance, in the example above there are 179 valid ECC indices to assign to "goodcodes" and there are 77 remaining error codes that can be used as "badcodes". To achieve this approximate distribution, ECC indices that have 2, 6, 7, or 8 1s in their binary representation are added to this pool of "badcodes". ECC indices that have 0, 1, 3, 4, or 5 1 s in their binary representation are added to the pool of "goodcodes". This gives a total of 65 "badcodes" and 191 "goodcodes". Continuing with the above example, the "badcodes" and "goodcodes" are given as follows:

Badcodes: {3, 5, 6, 9, 10, 12, 17, 18, 20, 24, 33, 34, 36, 40, 48, 63, 65, 66, 68, 72, 80, 95, 96, 111, 119, 123, 125, 126, 127, 129, 130, 132, 136, 144, 159, 160, 175, 183, 187, 189, 190, 191, 192, 207, 215, 219, 221, 222, 223, 231, 235, 237, 238, 239, 243, 245, 246, 247, 249, 250, 251, 252, 253, 254, 255}
Goodcodes: { 0, 1, 2, 4, 7, 8, 11, 13, 14, 15, 16, 19, 21, 22, 23, 25, 26, 27, 28, 29, 30, 31, 32, 35, 37, 38, 39, 41, 42, 43, 44, 45, 46, 47, 49, 50, 51, 52, 53, 54, 55, 56, 57, 58, 59, 60, 61, 62, 64, 67, 69, 70, 71, 73, 74, 75, 76, 77, 78, 79, 81, 82, 83, 84, 85, 86, 87, 88, 89, 90, 91, 92, 93, 94, 97, 98, 99, 100, 101, 102, 103, 104, 105, 106, 107, 108, 109, 110, 112, 113, 114, 115, 116, 117, 118, 120, 121, 122, 124, 128, 131, 133, 134, 135, 137, 138, 139, 140, 141, 142, 143, 145, 146, 147, 148, 149, 150, 151, 152, 153, 154, 155, 156, 157, 158, 161, 162, 163, 164, 165, 166, 167, 168, 169, 170, 171, 172, 173, 174, 176, 177, 178, 179, 180, 181, 182, 184, 185, 186, 188, 193, 194, 195, 196, 197, 198, 199, 200, 201, 202, 203, 204, 205, 206, 208, 209, 210, 211, 212, 213, 214, 216, 217, 218, 220, 224, 225, 226, 227, 228, 229, 230, 232, 233, 234, 236, 240, 241, 242, 244, 248}

Once the ECC indices have been divided into "goodcodes" and "badcodes" the indices are ordered such that an error code resulting from three physically consecutive bit errors will map to one of the "badcodes". That is, ECC indices are assigned to physical bit locations such that the XOR of the indices corresponding to any 3 consecutive physical bit locations yields a "badcode". With such a mapping, an error can be quickly detected by adding up the number of 1s in the returned error code. If the number of 1s maps to the set of "badcodes" (i.e. the number of 1s is 2, 6, 7, or 8), then an uncorrectable error is detected. It is noted that other types of errors that are not three bit burst errors may also map to a "badcode" if the XOR of the ECC indices of the corrupted bit locations happens to be a "badcode". Thus, although a mapping may be designed to ensure that all three bit burst errors are detectable, some other occurrences of errors to three or more bits will also end up being detectable. An example mapping having the above described characteristics is provided in the table of FIGS. 7A-7C. This is only one such mapping and other mappings are possible that have the same property.

To illustrate the desirable properties of the above mapping, consider an example three bit burst error occurring at physical bit locations 155:157. The resulting error code will be the XOR of indices corresponding to each of these physical bit locations: XOR(11100011, 11010101, 10110100)=10000010. As desired, the resulting error code has 2 bits set to 1, which means it is in the set of "badcodes". Thus, a three bit burst error is detected.

Figure 4:
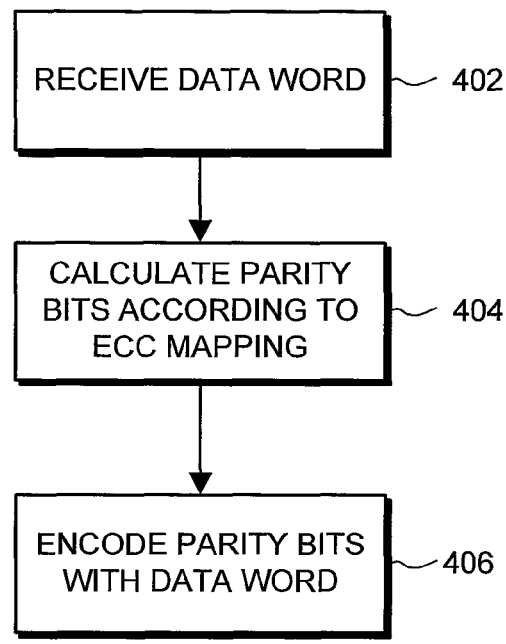
FIG. 4 is a flowchart illustrating an example embodiment of a process for encoding a data word for error detection and correction.

Given an ECC mapping having the above described properties, a process is illustrated in FIG. 4 for encoding an incoming data word according to an embodiment. An input data word 102 is received 402 by the ECC encoding module 106. Parity bits are then calculated 404 according to a mapping provided in the ECC index map 108. The mapping 108 indicates which physical bit locations are associated with each parity bit for the purpose of the parity calculation. Generally, a parity bit, Px, is associated with a bit location if the ECC index mapped to the bit location has a 1 at position x in the binary representation of the ECC index. For instance, using the example mapping in the table of FIGS. 7A-C, bit location 107 having an ECC index 10011011 is associated with parity bits P8, P5, P4, P2, and P1. To calculate a particular parity bit, the parity bit is set such that the parity bit together with all physical bit locations associated with the parity bit XOR to 0. For example, using the mapping of FIGS. 7A-C, parity bit P1 will is calculated as the XOR of bits including those at physical bit locations 3, 6, 8, 9, 10, 11, 15, 16, . . . etc. because each of these physical bit locations have the P1 bit (position 1) set in the binary representation of their ECC index. Note that the technique for calculating the parity bits is similar to the parity calculation technique described above for the SEC coding, except that the physical bit locations associated with each parity bit follow the mapping illustrated in FIGS. 7A-C rather than a direct mapping. Also note that, in one embodiment, calculating 404 the parity bits includes calculating an extra parity bit, P0, over the entire encoded word (including parity bits) as described above.

Once all the parity bits are calculated, the parity bits are encoded 406 together with the data word. Typically, as described above, parity bits are placed at physical bit locations corresponding to powers of 2 and the data bits fill in the remaining bit locations. However, as will be apparent to those of ordinary skill in the art, alternative orderings of the encoded word are possible.

Figure 5:
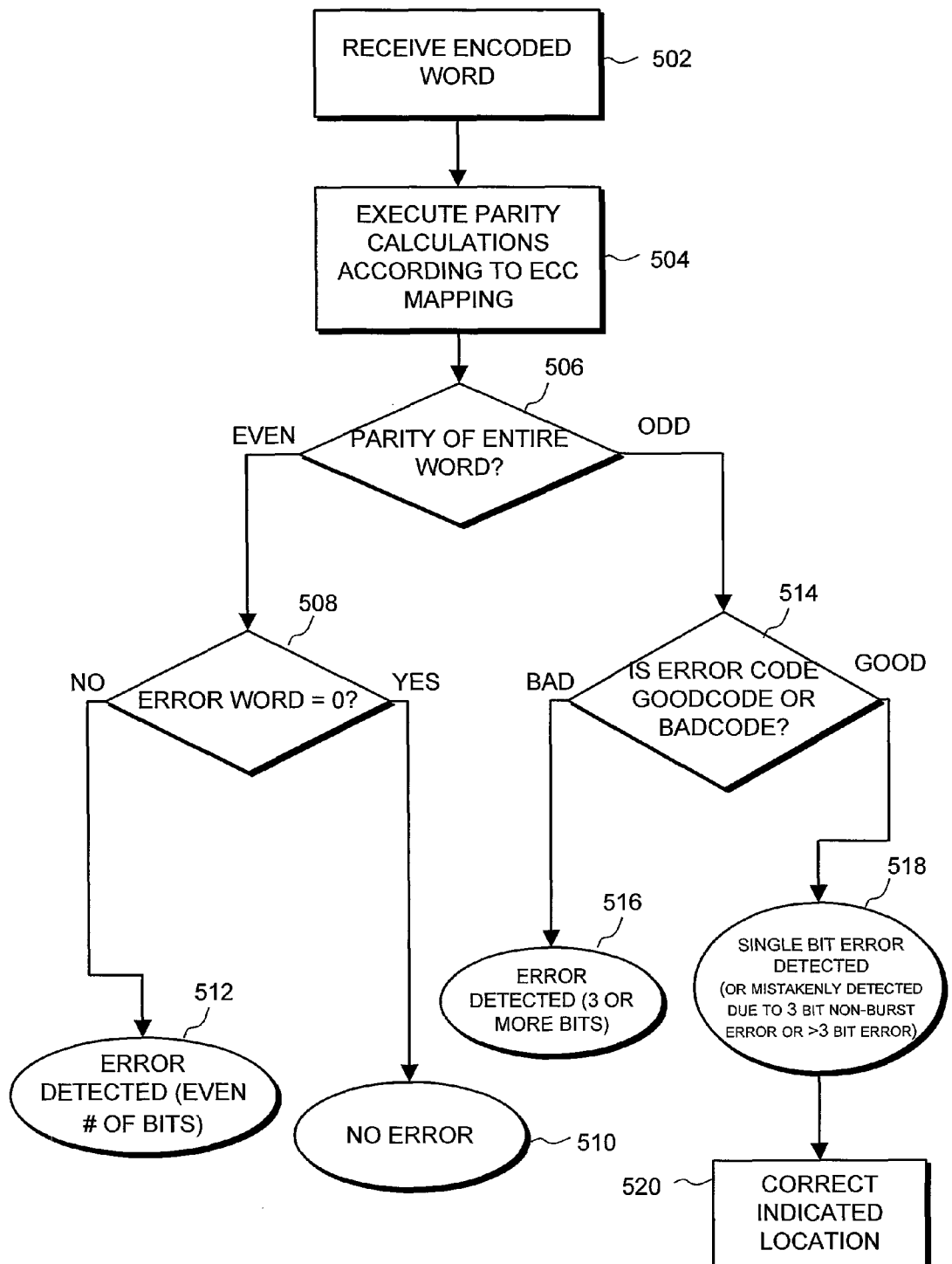
FIG. 5 is a flowchart illustrating an example embodiment of a process for correcting and/or detecting errors in a received encoded word.

Turning now to FIG. 5, a method is illustrated for performing error correction/detection on an encoded word. The ECC correction/detection module 112 receives 502 an encoded word 114 (that may be corrupted). The ECC correction/detection module 112 executes 504 parity calculations according to the ECC mapping 108 for each parity bit to determine if the parity bits are still correct (i.e. each parity bit together with its associated subset of parity bits still XOR to 0). For example, using the sample mapping illustrated in FIGS. 7A-C, a parity calculation for P1 is executed by computing the XOR of bits at physical bit locations including location 1, 3, 6, 8, 9, 10, 11, 15, 16, etc. because each of these bit locations is mapped to an ECC index that has the P1 bit set to 1 in its binary representation. The parity calculation yields an error code with each bit of the error code corresponding to one of the parity bits. In addition, a parity calculation for P0 is executed by computing 506 the parity over the entire received word. If the parity over the entire word is even (i.e. P0 is still correct), this indicates that there is an even number of bit errors. The ECC correction/detection module 112 determines 508 if the error code is all zeros. If the error code is all zeros, then the ECC correction/detection module 112 determines 510 that no error is detected. If, on the other hand, the error word is non-zero, then the ECC correction/detection module 112 determines 512 that an uncorrectable error is detected having an even number of bits.

If the parity calculation over the entire word is odd (i.e. P0 is incorrect), this indicates that there is an odd number of bit errors. The error code is then examined to determine 514 if the error code is a "goodcode" or a "badcode". In the example mapping above, this can be determined simply by counting the number of 1s in the error code. If there is 2, 6, 7, or 8 1s in the error code, then the error code is a "badcode". If there is 0, 1, 3, 4, or 5 1s in the error code, then the error code is a "goodcode". If the error code is a "badcode", then the ECC correction/detection module 112 determines 516 that an uncorrectable error is detected. The uncorrectable error may be a three bit burst error or may be another error of three or more bits that maps to a "badcode".

If the error code is a "goodcode", then the ECC detection/correction module 112 determines 518 that a single bit error is detected. Furthermore, the physical bit location of the error can be determined by mapping the ECC index back to the physical bit location using the ECC mapping. For example, using the mapping in FIGS. 7A-C, an error code of 00011011 (27) indicates the bit error is at physical bit location 6. The error can then be corrected 520 by inverting the bit at the bit location of the error. Note that if an undetectable error occurs (e.g., some instances of non-burst three bit error or odd numbered error to more than three bits), the ECC correction/detection module 112 may mistakenly determine 518 that a single bit error occurred. For example, a five bit error or a three bit error to bits that are not physically contiguous may produce an error code that maps to a "goodcode" and is indistinguishable from a single bit error.

Note that in the case of errors to three or more bits, some instances are detected while others are not. For example, using the mapping of FIG. 7A-C, consider the case where a three bit error occurs at non-consecutive bits 10, 21 and 34. The resulting error code can be determined by XORing the ECC indices corresponding to these bit locations (00011001, 00101110, and 00100101 respectively). The resulting error code (00010010) has 2 bits set to 1 and is therefore a "badcode". Thus, this particular error would be detected.

In other instances, however, an error that is not a single bit error, even-numbered bit error, or three bit burst error, is undetectable and may instead be mistakenly identified as a single bit error. For example, if an error occurs at bits 0, 1, and 4, the resulting error code is 00001111. In this case, the error code is a "goodcode" and points to the ECC index corresponding to bit location 3. Thus, the actual error to bits 0, 1, and 4 is undetected and bit 3 is instead mistakenly "corrected". However, the ECC mapping is designed so that such undetectable errors are rare. Rather, the ECC mapping is configured to maximize the robustness of the error correction/detection module 112 by ensuring that all instances of the most common types of errors (e.g. single bit errors, two bit errors, and three bit burst errors) are detectable.

ECC Mapping

Figure 6:
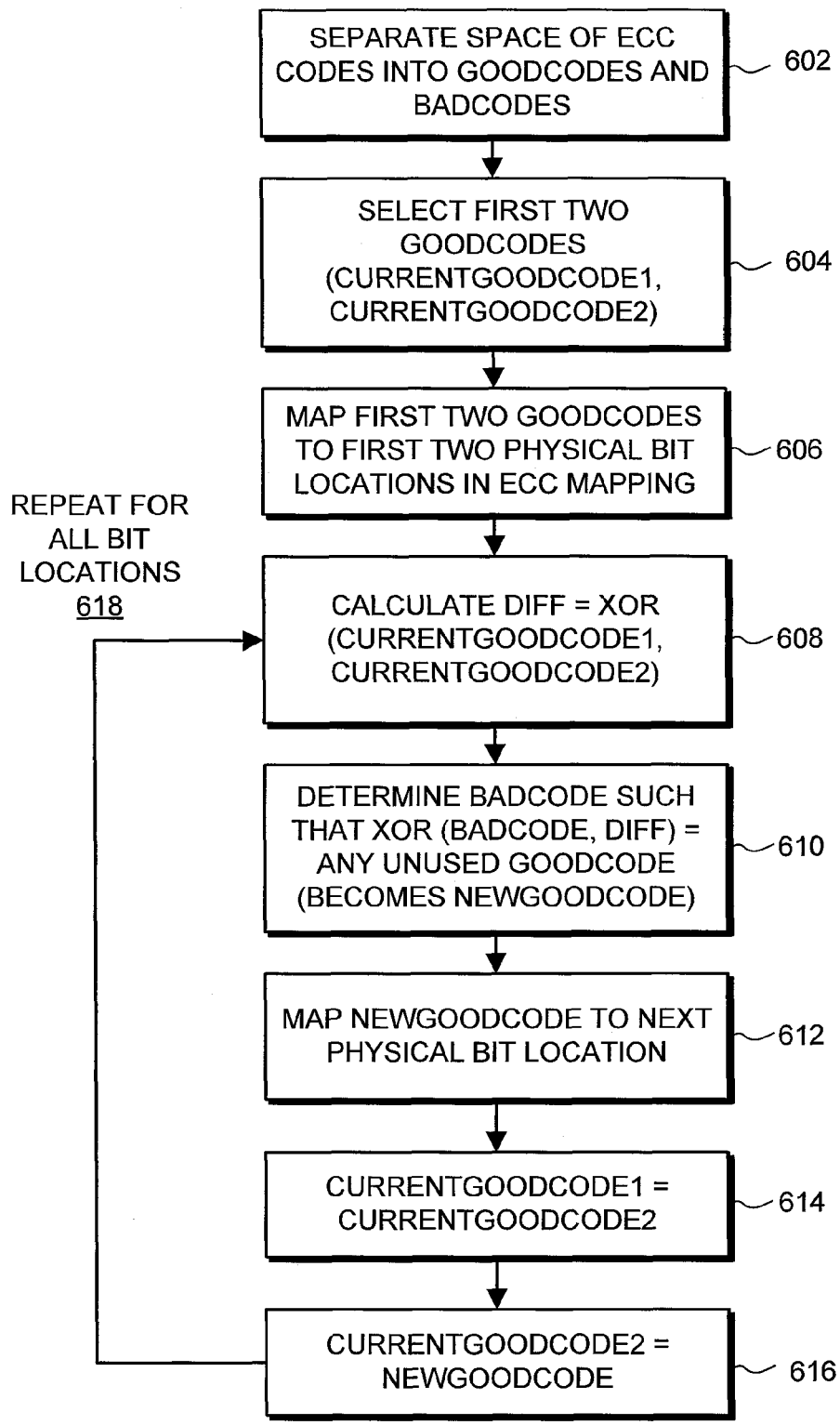
FIG. 6 is a flowchart illustrating an example embodiment of a process for determining an ECC mapping between ECC indices and physical bit locations.

FIG. 6 illustrates an example process represented in pseudo-code for determining the ECC mapping 108 between physical bit locations and the ECC index in accordance with one embodiment. It is noted that other processes for determining such a mapping are possible. A mapping having the above described characteristics need only be discovered once. Once the mapping is determined it can be hardcoded to the ECC mapping 108 for use in error correction and detection.

First the set of possible ECC indices are separated 602 into "goodcodes" and "badcodes". The particular distribution depends on the number of parity bits used and the size of the data word. Continuing with the example provided above, in one embodiment, any index that has 0, 1, 3, 4, or 5 1 bits in its binary representation is assigned to the set of "goodcodes" and any indices with 2, 6, 7, or 8 one bits in its binary representation is assigned to the set of "badcodes". Different assignments may be used for a different distribution of "goodcodes" and "badcodes".

From the set of "goodcodes", the first two are assigned 604 to variables currentgoodcode1 and currentgoodcode2 respectively. These first two "goodcodes" are mapped 606 to the first two physical bit locations (locations 0 and 1 respectively). For example, using the set of "goodcodes" above, the following applies:

currentgoodcode1=00000000;

currentgoodcode2=00000001;

Next a variable DIFF is calculated 608 as the XOR of currentgoodcode1 and currentgoodcode2:

DIFF=XOR(currentgoodcode1, currentgoodcode2);

From the set of "badcodes", a "badcode" is determined 610 such that XOR(badcode, DIFF) results in an unassigned "goodcode". This "goodcode" is designated newgoodcode and is mapped 612 to the next physical bit location.

For instance, in the example above, it is discovered that the next "badcode" 00000011 XORed with DIFF (00000001) yields 00000010 which is a "goodcode" that has not already been mapped to a physical bit location. Thus, newgoodcode is set to 00000010. Furthermore, the next physical bit location (bit location 2) is mapped to ECC index 00000010. currentgoodcode1 is then set 514 to currentcodegood2 (00000001) and currentgoodcode2 is set 616 to newgoodcode (00000010). The process then repeats 618 from step 608 until all the physical bit locations are mapped to an index value.

Column Multiplexing and Dual ECC Interleaving

In one embodiment, the ECC encoded words are interleaved (or scrambled) within a memory or data block transmission such that physically or temporally contiguous errors are mapped into different code words. For example, memories that utilize column multiplexing are constructed such that two (or more) physically adjacent bits actually correspond to separately addressed words (i.e. one or more of the address bits specifies which column is read). Thus for a column mux factor of 2, all two-bit errors are mapped to two single bit errors in separate code words.

In another embodiment, a larger data word (such as the 170 bit data word considered earlier) is split it into two smaller words. For example, the data word may be split such that a first block includes all bits of the original data word at odd bit locations and a second block includes all bits of the original data word at even bit locations (or vice versa). Independent ECC logic is used on each of the smaller data blocks. For example instead of the [179,170] error code described above, the data word can be split into two blocks, each encoded using a [93, 85] encoding. Using this approach the ECC correction/detection module is able to correct a physically contiguous two bit error. Similarly, using interleaving, the ECC correction/detection module can detect physically contiguous four bit errors. Finally, combining interleaving with the burst error detection techniques described above, the ECC correction/detection module can detect burst errors of up to six bits.

Note too that column multiplexing and ECC interleaving may be combined. For example, interleaving two codes on a memory incorporating a column mux factor of 2 allows the detection of 12 bit burst errors. Furthermore, the interleaving techniques can be extended by breaking the incoming data word into even smaller blocks prior to encoding. This allows for detection of even larger numbers of bit errors in exchange for using a larger number of parity bits.

Following the general strategy described above, an example [93,85] SECDED-TBD (Single Error Correction Double Error Detection-Triple Burst Detection) code is described. In this case, there are only 7 bits of parity (not counting P0) and thus the code can have 128 possible values. Of these 128 possible error codes only 93 are actually used as ECC indices. Thus the coding is again sparse. However, in this example there are only 35 unused codes (as compared to 77 unused codes for the case of the [179,170] code).

The table of FIG. 8 provides an example mapping for the [93, 85] code. In this example mapping, "goodcodes" are defined as those with 0, 1, 2, 3, 4, and 7 one bits set (there are 100 such goodcodes). "Badcodes" are defined as those with 5 or 6 bits set (there are 28 such badcodes). Again, the example mapping of FIG. 8 is only one possible mapping and other mappings are possible. In order to detect a triple bit burst error in the example above, the 1s in the error code [P7:P1] are added up and a three bit burst error is detected if there are 5 or 6 1s in the error code.

Alternative Embodiments

One of ordinary skill in the art will recognize that various alternative embodiments are possible without departing from the scope of the disclosure herein. For example, although various examples have been described for specific lengths of data words and number of parity bits, it will be apparent to one of ordinary skill in the art that the techniques can be applied to any (M, D) encoding. Furthermore, it is noted that while parity calculations have been described as providing even parity, alternative embodiments are implemented using odd parity schemes. For example, in one embodiment, the parity bits are encoded so that a parity bit together with its associated bits has an odd number of 1s. Furthermore, while various steps of the example embodiments describe counting the number of 1s in data words, alternative embodiments may instead count the number of 0s. Yet other variations of the described embodiments will be apparent to those of ordinary skill in the art.

Reference in the specification to "one embodiment" or to "an embodiment" means that a particular feature, structure or characteristic described in connection with the embodiments is included in at least one embodiment. The appearances of the phrase "in one embodiment" in various places in the specification are not necessarily all referring to the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the disclosure include process steps and instructions described herein in the form of an algorithm. It should be noted that the process steps and instructions could be embodied in software, firmware or hardware, and when embodied in software, could be downloaded to reside on and be operated from different platforms used by a variety of operating systems.

The disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatuses to perform the required method steps. The required structure for a variety of these systems will appear from the description below. In addition, the disclosed embodiments are not described with reference to any particular programming language. It will be appreciated that a variety of programming languages may be used to implement the teachings described herein, and any references below to specific languages are provided for disclosure of enablement and best mode.

In addition, the language used in the specification has been principally selected for readability and instructional purposes, and may not have been selected to delineate or circumscribe the inventive subject matter. Accordingly, the disclosure is intended to be illustrative, but not limiting, of the scope of the embodiments, which is set forth in the claims.

The invention claimed is:

1. A method for encoding an input data word for error detection and correction comprising:
   receiving the input data word;
   calculating parity bits based on the input data word and an ECC index mapping, wherein the ECC index mapping maps each physical bit location to an ECC index such that an XOR operation executed on ECC indices corresponding to three physically consecutive bits produces an error word distinguishable from each of the ECC indices mapped to the physical bit locations; and
   encoding the calculated parity bits with the input data word.

2. The method of claim 1, wherein calculating the parity bits further comprises calculating a P0 bit,
   wherein the P0 bit is set to a first value if the input data word and the calculated parity bits collectively have even parity, and the P0 bit is set to a second value if the input data word and the calculated parity bits collectively have odd parity.

3. The method of claim 1, wherein calculating the parity bits comprises:
   associating a first parity bit with a first subset of physical bit locations based on the ECC index mapping; and
   calculating the first parity bit based on a numbers of 1s in bits of the input data word located at the associated first subset of physical bit locations.

4. The method of claim 1, wherein encoding the calculated parity bits with the input data words comprises:
   storing the parity bits at bit locations that are powers of 2 within an encoded data word; and
   storing data bits of the input data words at bit locations that are not powers of 2 within the encoded data word.

5. The method of claim 1, wherein each of the ECC indices corresponding to the physical bit locations belongs to a predetermined set of goodcodes, and wherein the error code word produced from executing the XOR operation on the ECC indices corresponding to the three physically consecutive bits belongs to a predetermined set of badcodes.

6. The method of claim 5, wherein the error code word belongs to the predetermined set of goodcodes if the error code word has a first predetermined number of 1s in its binary representation, and wherein the error code word belongs to the predetermined set of badcodes if the error code word has a second predetermined number of s in its binary representation.

7. The method of claim 1, further comprising separating adjacent bits of a double length input data word into the input data word and a second input data word, wherein the input data word comprises bits at even bit locations of the double length input data word and the second input data word comprises bits at odd bit locations of the double length input data word.

8. A method for error correction and detection of an encoded word comprising:
receiving the encoded word;
executing a parity calculation on the encoded word to determine an error code word based on an ECC index mapping between bit locations of the encoded word and ECC indices, wherein the error code word resulting from a single bit error at a corrupted bit location comprises a matching ECC index corresponding to the corrupted bit location, and wherein the error code word resulting from errors in three physically consecutive bits of the encoded word is distinguishable from each of the ECC indices; and
determining if the encoded word has an error based on the parity calculation.

9. The method of claim 8, wherein executing the parity calculation further comprises determining a P0 bit representing parity of the entire encoded word, the method further comprising:
responsive to the P0 bit having a first value, indicating that an even number of bits of the encoded word have errors; and
responsive to the P0 bit having a second value, indicating that an odd number of bits of the encoded word have errors.

10. The method of claim 8, further comprising:
responsive to the error code word matching the matching ECC index corresponding to the corrupted bit location, correcting the error at the corrupted bit location.

11. The method of claim 8, further comprising:
responsive to the error code word not matching any of the ECC indices, setting a flag indicating an uncorrectable error.

12. The method of claim 8, further comprising:
determining a number of 1s in the binary representation of the error code word; and
responsive to the error code word having a first predetermined number of 1s, indicating that the error code word does not match any of the ECC indices.

13. A system for error correction and detection of an encoded word comprising:
a storage module for storing an ECC index mapping, wherein the ECC index mapping maps each physical bit location to an ECC index such that an error code word resulting from errors in three physically consecutive bits is distinguishable from an error code resulting from a single bit error;
an error correction/detection module coupled to the storage module, the error correction/detection module for receiving the encoded word and executing a parity calculation of the encoded word to determine an error code word according to the ECC index mapping; and
an output module for outputting an uncorrectable error flag responsive to the error correction/detection module detecting a three bit burst error or an error to an even number of bits, and outputting a correct data word responsive to the error correction/detection module detecting and correcting a single bit error.

14. The system of claim 13, wherein the error correction/detection module further determines a P0 bit representing parity of the entire encoded word, indicates that an even number of bits of the encoded word have errors responsive to the P0 bit having a first value, and indicates that an odd number of bits of the encoded word have errors responsive to the P0 bit having a second value.

15. The system of claim 13, wherein the error correction/detection module further corrects the error at a corrupted bit location responsive to the error code word matching a matching ECC index corresponding to the corrupted bit location.

16. The system of claim 13, wherein the error correction/detection module further indicates an uncorrectable error responsive to the error code word not matching any of the ECC indices.

17. The system of claim 13, wherein the error correction/detection module further determines a number of 1s in the binary representation of the error code word, and indicates the presence of a three bit burst error responsive to the error code word having a first predetermined number of 1s.

18. The system of claim 13, wherein the ECC index mapping indicates associations between physical bit locations of the encoded word and parity bits of the error code word, wherein a first parity bit of the error code word is associated with a first subset of physical bit locations based on the ECC index mapping, and wherein the first parity bit is calculated based on a numbers of 1s in bits of the encoded data word located at the associated first subset of physical bit locations.

19. The system of claim 13, further comprising:
a column multiplexing module for addressing the encoded data word, wherein bits of the encoded data word are interleaved with bits of a second encoded data word.

20. The system of claim 13, wherein each of the ECC indices corresponding to the physical bit locations in the ECC index mapping belongs to a predetermined set of goodcodes, and wherein the error code word produced from executing the XOR operation on the ECC indices corresponding to the three physically consecutive bits belongs to a predetermined set of badcodes.

* * * * *

UNITED STATES PATENT AND TRADEMARK OFFICE
CERTIFICATE OF CORRECTION

PATENT NO.        : 8,069,395 B2
APPLICATION NO.   : 12/038886
DATED             : November 29, 2011
INVENTOR(S)       : Deierling et al.

It is certified that error appears in the above-identified patent and that said Letters Patent is hereby corrected as shown below:

In the Claims:

Column 15, Claim 6, Line 3, please delete "s" and insert --1s-- therefor.

Signed and Sealed this
Thirteenth Day of March, 2012

David J. Kappos
*Director of the United States Patent and Trademark Office*